(12) United States Patent
Matiss et al.

(10) Patent No.: US 8,465,214 B2
(45) Date of Patent: Jun. 18, 2013

(54) ARRANGEMENT COMPRISING AN ELECTRICAL CONDUCTOR TRACK CARRIER AND AN OPTOELECTRONIC COMPONENT, AND A METHOD FOR PRODUCING SUCH AN ARRANGEMENT

(75) Inventors: Andreas Matiss, Berlin (DE);
Alexander Jacob, Berlin (DE);
Christoph Leonhardt, Berlin (DE)

(73) Assignee: U2T Photonics AG, Berlin (DE)

( * ) Notice: Subject to any disclaimer, the term of this patent is extended or adjusted under 35 U.S.C. 154(b) by 190 days.

(21) Appl. No.: 13/057,432

(22) PCT Filed: Jan. 21, 2010

(86) PCT No.: PCT/DE2010/000079
§ 371 (c)(1),
(2), (4) Date: Feb. 3, 2011

(87) PCT Pub. No.: WO2010/105588
PCT Pub. Date: Sep. 23, 2010

(65) Prior Publication Data
US 2011/0135255 A1    Jun. 9, 2011

(30) Foreign Application Priority Data
Mar. 18, 2009   (DE) .......................... 10 2009 013 866

(51) Int. Cl.
*G02B 6/36* (2006.01)
(52) U.S. Cl.
USPC ............................................ 385/92; 29/840
(58) Field of Classification Search
USPC .......... 385/92; 29/840, 827; 439/81; 437/218
See application file for complete search history.

(56) References Cited

U.S. PATENT DOCUMENTS

| 5,026,134 | A | 6/1991 | Sugawara et al. |
| 5,198,391 | A | 3/1993 | Rosel et al. |
| 6,377,742 | B1 * | 4/2002 | Go ................................ 385/134 |
| 6,715,934 | B2 | 4/2004 | Suzuki et al. |
| 2003/0059177 | A1 | 3/2003 | Suzuki et al. |
| 2008/0032526 | A1 * | 2/2008 | Takahashi ........................ 439/81 |

FOREIGN PATENT DOCUMENTS

| DE | 41 19 741 C1 | 11/1992 |
| EP | 1 885 026 A1 | 2/2008 |
| WO | WO-00/73831 A1 | 12/2000 |

OTHER PUBLICATIONS

German Examination Report; DE Application No. 10 2009 013 866.8; issued Nov. 16, 2009.
International Search Report in PCT/DE2010/000079 dated Jun. 25, 2010.

* cited by examiner

*Primary Examiner* — Ellen Kim
(74) *Attorney, Agent, or Firm* — Foley & Lardner LLP

(57) ABSTRACT

An arrangement including an electrical conductor track carrier and a component applied on the conductor track carrier. The component is a fiber-optoelectronic component and has: a housing, at least one electro-optical or optoelectronic component, at least one fiber-optic interface connected to the electro-optical or optoelectronic component, and at least one electrical interface for connecting the component on the conductor track carrier. The electrical interface has at least one bent electrical soldering connection element which is attached by one end to a base connection section of the housing base and extends from there laterally toward the outside so that the other end of the soldering connection element projects laterally and is soldered laterally outside the outer housing contour on the conductor track carrier. The soldering connection element is bent away from the base connection section so that the base connection section is at a distance from the conductor track carrier.

15 Claims, 5 Drawing Sheets

Figure 1:
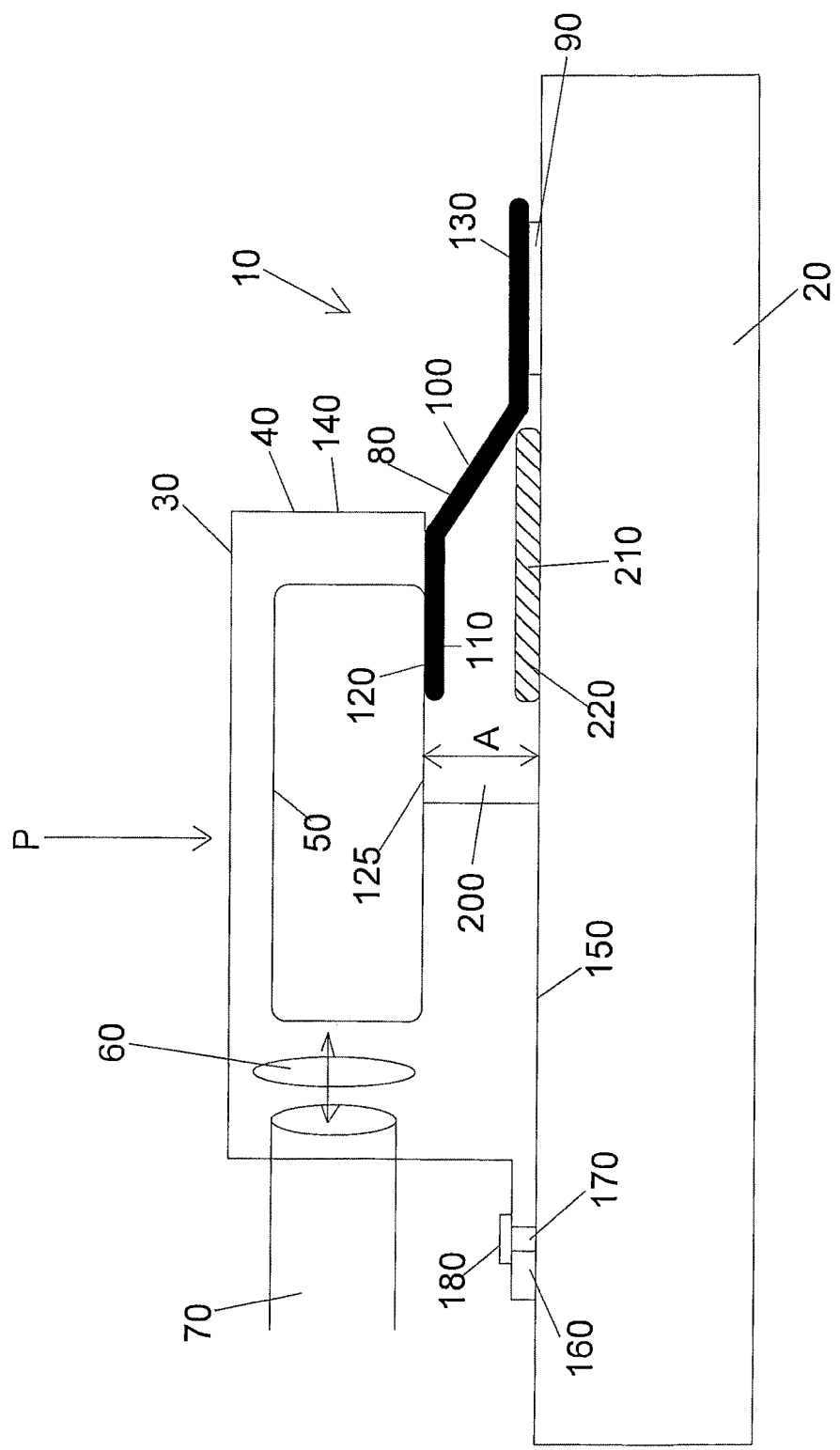

ARRANGEMENT COMPRISING AN ELECTRICAL CONDUCTOR TRACK CARRIER AND AN OPTOELECTRONIC COMPONENT, AND A METHOD FOR PRODUCING SUCH AN ARRANGEMENT

The invention relates to an arrangement comprising an electrical conductor track carrier and a component applied on the conductor track carrier.

In the field of printed circuit board technology, electrical interfaces formed by so-called BGAs (ball grid arrays) are known, inter alia. In the case of these interfaces, small solder balls or solder beads arranged in a matrix-like fashion below the component are soldered to the conductor track carrier. The soldering takes place in a reflow furnace.

For applying fiber-optoelectronic components having electro-optical or optoelectronic components and fiber-optic interfaces, soldering processes in a reflow furnace cannot be used, or at least can only be used to a restricted extent, namely because the fiber-optic interfaces are very sensitive to heat and usually do not withstand the thermal loads occurring during reflow soldering. This is due to the fact that fiber-optic interfaces generally comprise plastics, which melt or are damaged in some other way at the soldering temperature. Therefore, fiber-optoelectronic components with fiber-optic interfaces generally cannot be soldered on printed circuit boards with BGA interfaces or by means of reflow soldering processes in reflow furnaces.

Furthermore, it is known for components having electrical soldering connection elements led out laterally from the housing to be soldered on conductor track carriers using so-called SMD technology (SMD: surface-mounted device). What is problematic, however, is that such interfaces, on account of differing thermal expansion of the materials, the soldering connections are subjected to relatively high mechanical stress, particularly in the case of large housings, such that damage to the electrical interface can occur. Moreover, it is not readily possible to transmit high signal frequencies of 20 GHz or more via the known SMD interfaces. Consequently, the known SMD interface technology is likewise not particularly suitable for soldering fiber-optoelectronic components on conductor track carriers.

The invention is based on the object of specifying an arrangement comprising an electrical conductor track carrier and a fiber-optoelectronic component applied on the conductor track carrier, which arrangement is suitable for signal frequencies of 20 GHz or more and can be produced simply and cost-effectively.

This object is achieved according to the invention by means of an arrangement comprising the features in accordance with Patent Claim 1; advantageous configurations of the invention are specified in the dependent claims.

Accordingly, the fiber-optoelectronic component has, according to the invention: a housing, at least one electro-optical or optoelectronic component, at least one fiber-optic interface connected to the electro-optical or optoelectronic component, and at least one electrical interface for connecting the component on the conductor track carrier, wherein the electrical interface has at least one bent electrical soldering connection element which is attached by one end thereof to a base connection section of the housing base and extends from there laterally toward the outside in such a way that the other end of the soldering connection element—in plan view—projects laterally and is soldered laterally outside the outer housing contour on the conductor track carrier, and wherein the soldering connection element is bent away from the base connection section in such a way that the base connection section is at a distance from the conductor track carrier.

One essential advantage of the arrangement according to the invention can be seen in the fact that said arrangement enables very high electrical operating or signal frequencies such as are used in the field of optical data transmission. This can be attributed to the bent soldering connection elements which extend from below the housing laterally out from the outer contour of the housing and are soldered laterally alongside the housing on the conductor track carrier. The bent region of the soldering connection element reduces reflections, such that the electrical interface is suitable for signal frequencies of 20 GHz or more such as can be processed by components appertaining to optical telecommunications.

A further essential advantage of the arrangement according to the invention can be seen in the fact that said arrangement avoids mechanical stresses in the region of the electrical interface since mechanical play is provided by the distance provided according to the invention between the housing and the conductor track carrier in the region of the base connection section. Said play absorbs mechanical stresses, such that the soldering locations that connect the other end of the soldering connection elements to the conductor track carrier are mechanically relieved.

In order to reduce reflections in the region of the electrical interface even further, it is considered to be advantageous if a characteristic impedance matching element is present in at least one partial section of the gap between the base connection section and the conductor track carrier.

Preferably, the gap between the base connection section and the conductor track carrier is at least partly filled with a material having a relative permittivity of greater than 1. By way of example, a coating with said material is applied on the conductor track carrier in the region of the gap. Preferably, the coating consists of a different material than the conductor tracks of the conductor track carrier.

It is also considered to be advantageous if the housing base has a base bearing section, which bears directly on the conductor track carrier. Preferably, the housing has at least one fixing section screwed to the conductor track carrier. In accordance with one particularly preferred configuration of the arrangement, it is provided that the fixing section has a fixing hole, through which a fixing screw extends, wherein the diameter of the fixing hole is dimensioned to be greater than the diameter of the fixing screw, such that a play that reduces mechanical stresses is present between fixing hole and fixing screw.

The electrical interface preferably comprises a plurality of bent electrical soldering connection elements, which form one or a plurality of coplanar electrical lines. Coplanar electrical lines which are operated or can be operated with differential signals are involved, for example.

In order to reduce mechanical stresses even further, to achieve better heat dissipation during soldering and to improve the solder distribution, preferably at least one bent electrical soldering connection element is slotted and forms at least two mutually adjacent electrical individual conductors. Preferably, the heat capacity of all the unslotted soldering connection elements among one another is equal in magnitude, and it is preferably at least approximately of the same magnitude as the heat capacity of the individual conductors of the slotted soldering connection elements.

Preferably, a group of mutually adjacent bent electrical soldering connection elements is electrically connected up in the order ground, signal, ground, signal, ground, in order to transmit signals with particularly low interference.

The central soldering connection element of the group, said soldering connection element being connected to ground, is preferably slotted and forms in each case two mutually adjacent individual ground conductors, such that the electrical connection configuration ground, signal, ground, ground, signal, ground arises at the interface with the conductor track carrier.

The thickness of the soldering connection elements connected up as ground conductors and the thickness of the soldering connection elements connected up as signal conductors are preferably equal in magnitude.

The ratio between the width of an unslotted ground conductor and the width of a signal conductor is preferably less than or equal to two.

The ratio between the width of an individual ground conductor of a slotted soldering connection element that is at ground potential and the width of a signal conductor is preferably less than or equal to two.

The invention furthermore relates to a method for producing an arrangement comprising an electrical conductor track carrier and a component, wherein the component is soldered on the conductor track carrier in the method.

According to the invention, it is provided that a fiber-optoelectronic component, having a housing, at least one electro-optical or optoelectronic component, at least one fiber-optic interface connected to the component, and at least one electrical interface for connecting the component on the conductor track carrier, is soldered on the conductor track carrier by a procedure in which at least one bent electrical soldering connection element which is attached by one end thereof to a base connection section of the housing base and extends from there laterally toward the outside in such a way that the other end of the soldering connection element projects laterally is soldered laterally outside the outer housing contour on the conductor track carrier, wherein a distance is maintained in the base connection with section between the housing base and the conductor track carrier.

With regard to the advantages of the method according to the invention, reference should be made to the above explanations in connection with the arrangement according to the invention.

Preferably, a characteristic impedance matching is performed in at least one partial section of the gap between the base connection section and the conductor track carrier.

Figure 2:
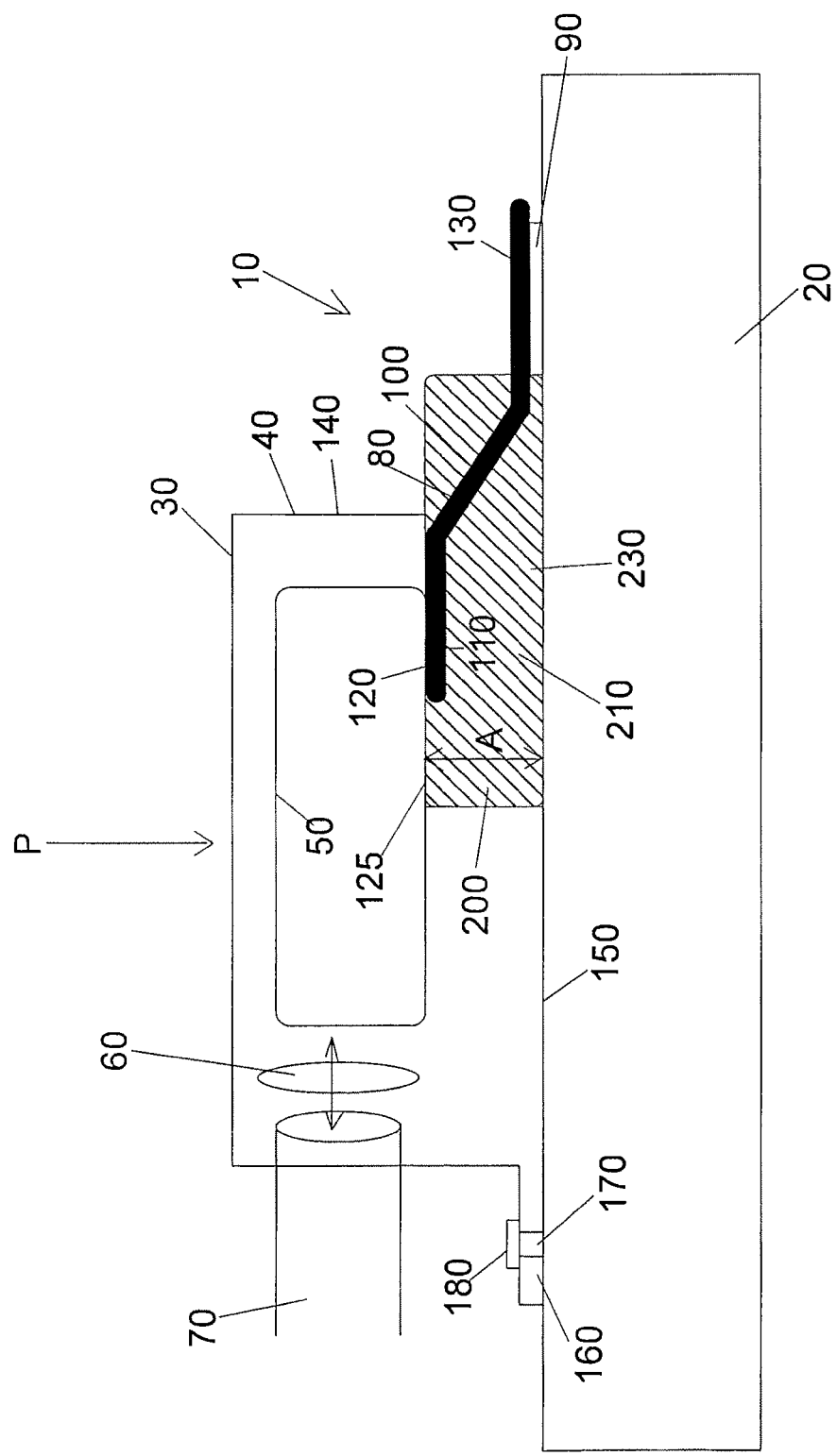
Figure 3:
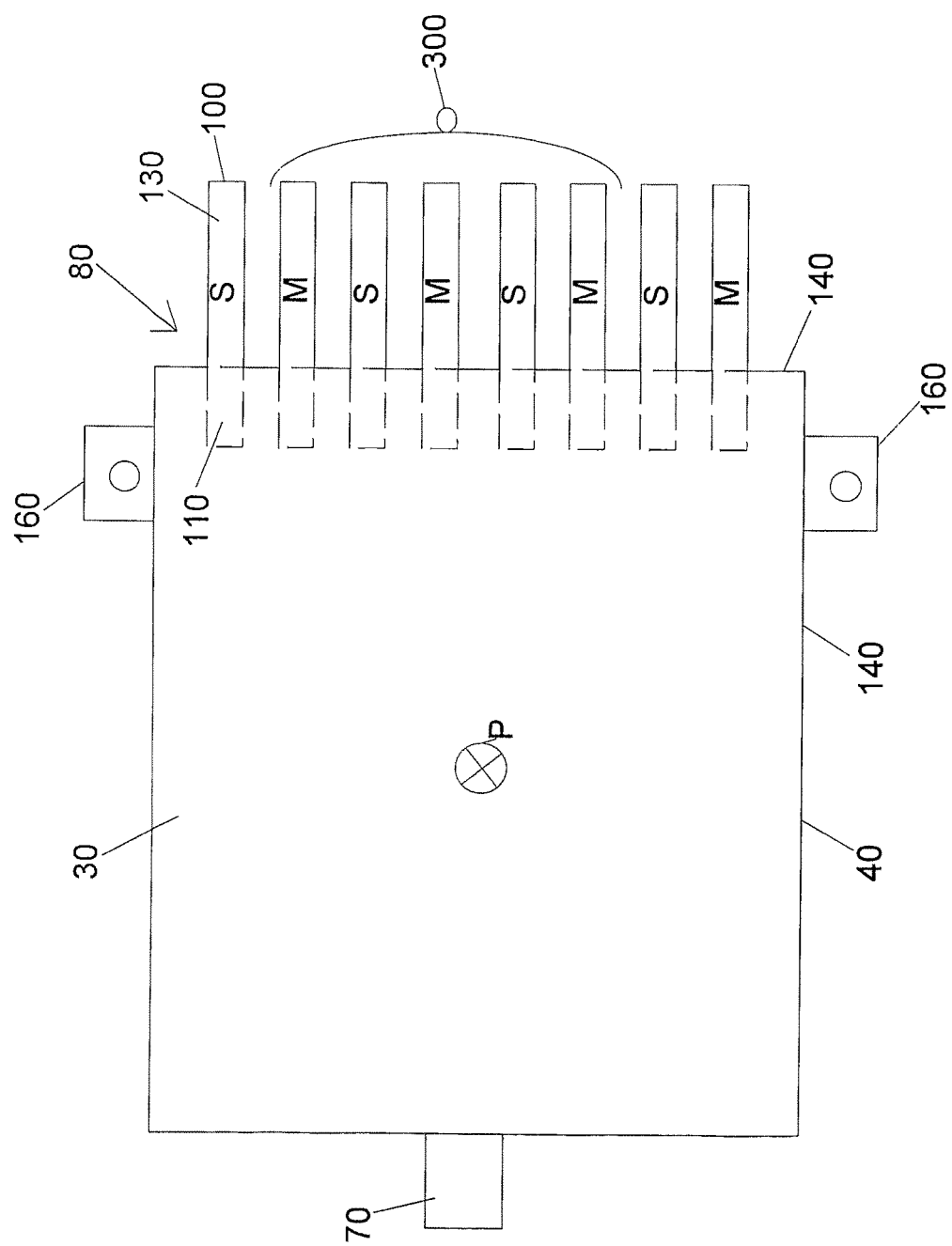
Figure 4:
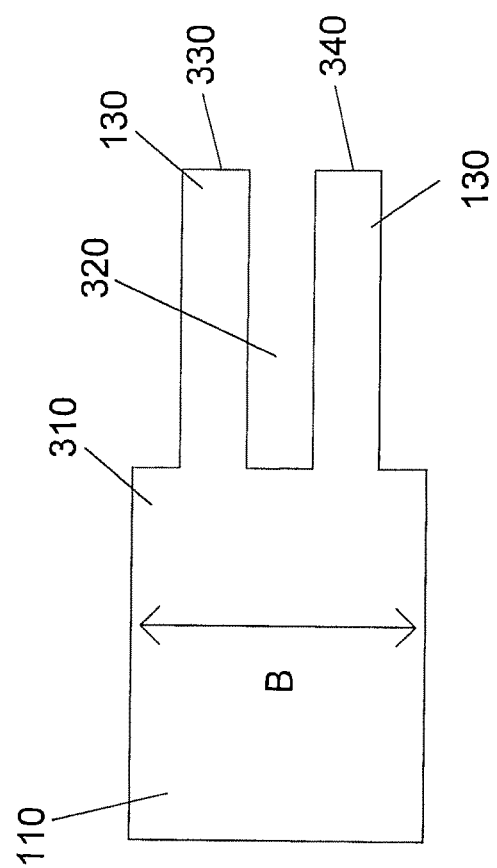
Figure 5:
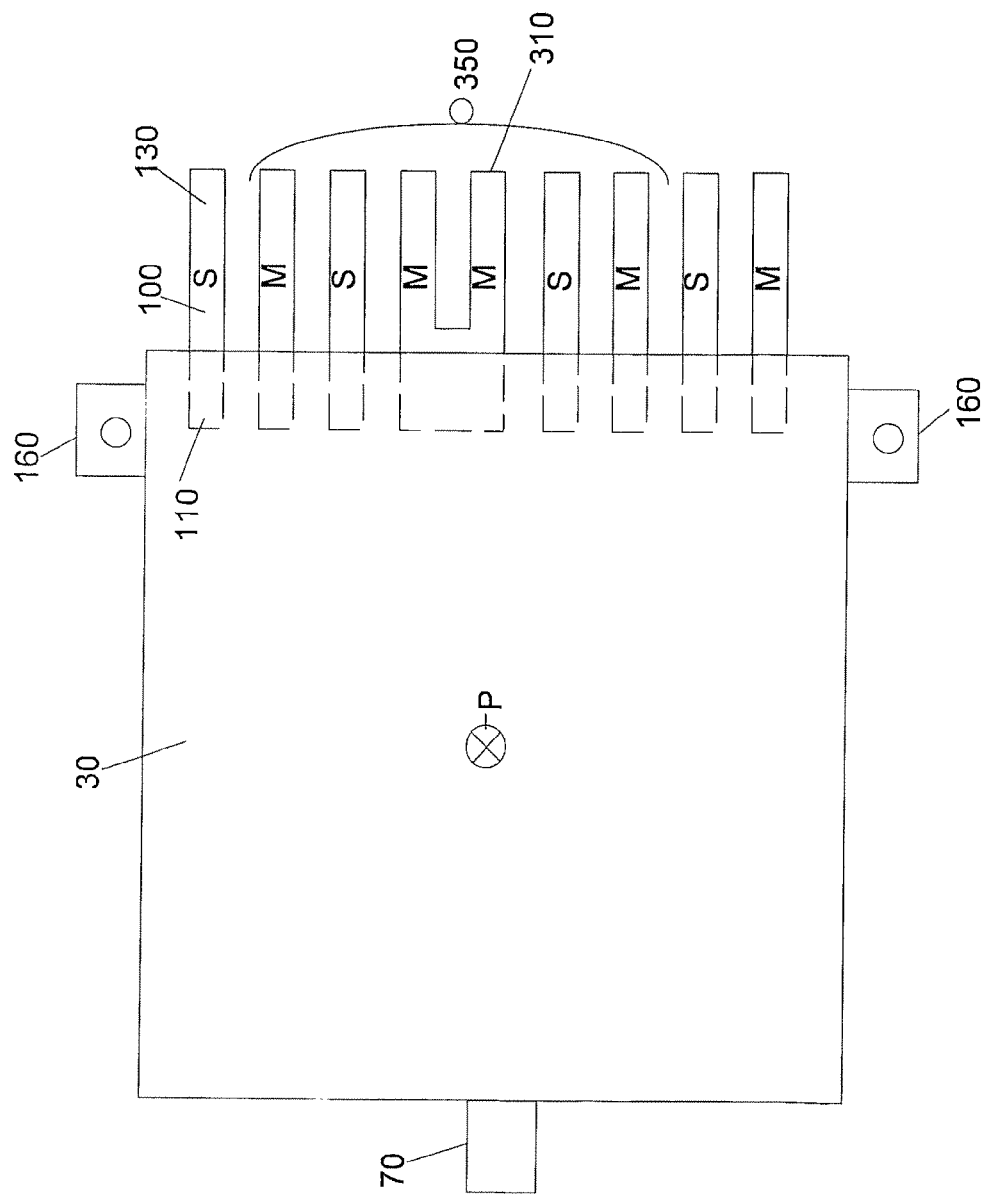

The invention is explained in greater detail below on the basis of exemplary embodiments; in the figures, by way of example:

FIG. 1 shows a first exemplary embodiment of an arrangement according to the invention comprising an electrical conductor track carrier and a component situated on the conductor track carrier, wherein a characteristic impedance matching element is formed by a coating, FIG. 2 shows a second exemplary embodiment of an arrangement according to the invention comprising a conductor track carrier and a component situated thereon, wherein a characteristic impedance matching element is formed by a material filling the gap between component and conductor track carrier, FIG. 3 shows the arrangement in accordance with FIG. 1 or 2 in plan view, FIG. 4 shows an exemplary embodiment of a slotted soldering connection element, and FIG. 5 shows an exemplary embodiment of an arrangement according to the invention in plan view with a slotted soldering connection element that forms a ground conductor.

In the figures, for the sake of clarity, the same reference symbols are always used for identical or comparable components.

FIG. 1 illustrates an arrangement 10 comprising an electrical conductor track carrier 20, on which a fiber-optoelectronic component 30 is fixed. The fiber-optoelectronic component 30 has a housing 40, in which an electro-optical or optoelectronic component 50 is integrated.

The electro-optical or optoelectronic component 50 is connected to an optical waveguide 70, for example an optical fiber, via a fiber-optic interface 60, for example via an optical fiber interface. The optical interface 60 is fixed in or on the housing 40.

The component 50 is connected to conductor tracks 90 of the electrical conductor track carrier 20 via an electrical interface 80.

The electrical interface 80 comprises a multiplicity of bent soldering connection elements 100 each attached by one end 110 thereof to a base connection section 120 of the housing 40 or of the housing base 125; by their other end 130 the soldering connection elements 100 are soldered on the conductor tracks 90.

FIG. 1 reveals that the soldering connection elements 100 are bent away from the base connection section 120 downward or are bent toward the conductor track carrier 20, such that the base connection section 120 of the housing 40 is at a distance A from the surface of the electrical conductor track carrier 20. The gap 200 between the base connection section 120 and the electrical conductor track carrier 20 is bridged by the bent soldering connection elements 100.

Furthermore, it is evident in FIG. 1 that the bent soldering connection elements 100 extend laterally toward the outside and are soldered laterally—in plan view or viewed from above along the arrow direction P—outside the outer housing contour 140 of the housing 40 on the conductor track carrier 20. In other words, the soldering locations that connect the other end 130 of the bent soldering connection elements to the conductor tracks 90 are not situated below the housing 40, but rather laterally alongside the housing 40.

In FIG. 1 it is furthermore evident that the housing 40 has a base bearing section 150, which bears directly on the electrical conductor track carrier 20 and is connected to the latter. The connection between the housing 40 and the electrical conductor track carrier 20 is effected by one or a plurality of fixing sections 160 of the housing 40, which enable the latter to be screwed on the conductor track carrier 20. For this purpose, the fixing sections 160 are each equipped with a fixing hole 170, through which a fixing screw 180 is led. The fixing screw 180 is screwed to the conductor track carrier 20. Preferably, the size of the fixing hole 170 is chosen in such a way that the housing 40 has a degree of play on the electrical conductor track carrier 20, thus preventing, or at least reducing, mechanical stresses after the housing 40 has been fixed on the conductor track carrier 20.

In order to have the effect that the fiber-optoelectronic component 30 can be operated with very high frequencies or with high bandwidths, the gap 200 between the base connection section 120 and the conductor track carrier 20 in the exemplary embodiment in accordance with FIG. 1 can be equipped with a characteristic impedance matching element 210. The characteristic impedance matching element 210 is based on a coating 220 applied on the conductor track carrier 20 in the region below the base connection section 120. The function of the coating 220 consists in preventing a situation in which, in the bent central section of the soldering connection element 100, the line characteristic impedance of the soldering connection element deviates greatly from the actual characteristic impedance of the coplanar line and reflections occur. In other words, the coating 220 is intended to ensure that an electrical signal that is transmitted from one end 110 to the other end 130 or conversely from the other end 130 to said one end 110 of the soldering connection element is not subjected to any electrical reflections that would corrupt the temporal signal profile.

The material of the coating 220 is preferably a different material than the material of the conductor tracks 90 associated with the electrical conductor track carrier 20. The relative permittivity of the coating 220 is preferably greater than 1. The coating 220 can consist of a polymer, for example.

FIG. 2 illustrates a second exemplary embodiment of an arrangement 10 comprising a fiber-optoelectronic component 30 and a conductor track carrier 20. It can be discerned that the characteristic impedance matching element 210 in the exemplary embodiment in accordance with FIG. 1 is not formed by a coating 220, but rather by a material 230 which fills the gap 200 and the relative permittivity of which is greater than 1. The material 230 which fills the gap 200 can consist of a polymer, for example. The material 230 therefore forms a characteristic impedance matching material which fills the gap 200 in the region of the soldering connection elements 100 or between the base connection section 120 and the conductor track carrier 20.

For the rest, the exemplary embodiment in accordance with FIG. 2 corresponds to the exemplary embodiment in accordance with FIG. 1, and so reference should be made to the above explanations in this regard.

FIG. 3 reveals the arrangement 10 in accordance with FIG. 1 or 2 in plan view (as seen along the arrow direction P). It can be discerned that the electrical interface 80 has a multiplicity of bent soldering connection elements 100 which extend laterally in a manner coming from the housing base toward the outside, such that the other ends 130 of the soldering connection elements 100 are arranged outside the outer contour 140 of the housing 40. That section of the soldering connection elements 100 which is concealed by the housing is identified by dashed lines. FIG. 3 also illustrates the optical waveguide 70, which is connected to the fiber-optic interface 60 (cf. FIGS. 2 and 3).

Furthermore, it can be discerned that the soldering connection elements form coplanar electrical lines and are operated alternately as ground conductor or signal conductor. In FIG. 3, signal conductors are identified by the reference symbol S and ground conductors by the reference symbol M.

FIG. 3 also reveals a group 300 comprising mutually adjacent bent electrical soldering connection elements which are electrically connected up in the order ground, signal, ground, signal, ground.

FIG. 3 additionally shows, by way of example, the fixing sections 160, by means of which the housing 40 is screwed on the conductor track carrier 20. FIG. 3 shows two fixing sections 160; it goes without saying that the number of fixing sections 160 is as desired.

FIG. 4 shows a further exemplary embodiment of an electrical soldering connection element. In contrast to the soldering connection elements illustrated in FIG. 3, the soldering connection element 310 in accordance with FIG. 4 is embodied in a slotted fashion, such that two mutually adjacent electrical individual conductors 330 and 340 separated by a slot 320 are formed.

The advantage of slotted soldering connection elements is that they are mechanically more elastic and, consequently, after soldering on the conductor track carrier 20, provide a greater mechanical flexibility for the connection between the housing 40 and the conductor track carrier 20 than unslotted soldering connection elements having the same width. Consequently, the electrical soldering connection element 310 is mechanically more flexible than would be the case if the width B of the soldering connection element 310 extended from one end 110 continuously as far as the other end 130; furthermore, the slot improves the thermal properties of the soldering connection elements and thus for example also the solder distribution during soldering. The electrical resistance is increased only insignificantly by the slot 320, depending on the slot width thereof, such that the total electrical resistance of a slotted soldering connection element may at least approximately correspond to the electrical resistance of an unslotted soldering connection element.

FIG. 5 shows an exemplary embodiment of an arrangement 10 wherein a slotted soldering connection element 310 is used. The slotted soldering connection element 310 forms together with adjacent soldering connection elements a soldering connection element group 350, in which the central, slotted soldering connection element is connected to ground. The group 350 thus forms an electrical connection configuration of the type ground, signal, ground, ground, signal, ground.

In the exemplary embodiments described above it is considered to be advantageous if the thickness of the soldering connection elements connected up as ground conductors and the thickness of the soldering connection elements connected up as signal conductors are equal in magnitude, at least substantially equal in magnitude. Moreover, it is considered to be advantageous if the ratio between the width of an unslotted ground conductor and the width of a signal conductor is less than or equal to 2. Moreover, the ratio between the width of an individual ground conductor of a slotted ground conductor—that is to say of a slotted soldering connection element to which ground potential is applied—and the width of a signal conductor should preferably be less than or equal to 2.

LIST OF REFERENCE SYMBOLS

10 Arrangement
20 Conductor track carrier
30 Component
40 Housing
50 Component
60 Optical interface
70 Optical waveguide
80 Electrical interface
90 Conductor track
100 Soldering connection element
110 One end
120 Base connection section
125 Housing base
130 Other end
140 Housing contour
150 Base bearing section
160 Fixing section
170 Fixing hole
180 Fixing screw
200 Gap
210 Characteristic impedance matching element
220 Coating
230 Material
300 Group
310 Soldering connection element
320 Slot
330 Individual conductor
340 Individual conductor
350 Group A Distance
B Width
M Ground conductor
P Arrow direction
S Signal conductor

The invention claimed is:

1. An arrangement (10) comprising an electrical conductor track carrier (20) and a component (30) applied on the conductor track carrier,
wherein the component is a fiber-optoelectronic component and has:
a housing (40),
at least one electro-optical or optoelectronic component (50),
at least one fiber-optic interface (60) connected to the electro-optical or optoelectronic component, and
at least one electrical interface (80) for connecting the component on the conductor track carrier,
wherein the electrical interface has at least one bent electrical soldering connection element (100), which extends laterally toward an outside of and is soldered laterally outside of an outer housing contour (140) on the conductor track carrier,
wherein the at least one bent electrical soldering connection element (100) is attached by one end (110) thereof to a base connection section (120) of a housing base (125) of the housing (40) and extends from there laterally toward the outside of the outer housing contour such that an other end (130) of the soldering connection element, in plan view, projects laterally and is soldered laterally outside of the outer housing contour (140) on the conductor track carrier, and
wherein the soldering connection element is bent away from the base connection section in such a way that the base connection section and with it the housing base (125) has a mechanical play constituting a distance (A) from the conductor track carrier.

2. The arrangement as claimed in claim 1, wherein a reflection reducing characteristic impedance matching element (210) is present in at least one partial section of a gap (200) between the base connection section and the conductor track carrier.

3. The arrangement as claimed in claim 1, wherein a gap (200) between the base connection section and the conductor track carrier is at least partially filled with a material (220, 230) having a relative permittivity of greater than 1.

4. The arrangement as claimed in claim 1, wherein a coating (220) is applied on the conductor track carrier in a region of a gap (200) between the base connection section and the conductor track carrier.

5. The arrangement as claimed in claim 4, wherein the coating consists of a different material than a material of the conductor tracks (90) of the conductor track carrier.

6. The arrangement as claimed in claim 1, wherein the housing base has a base bearing section (150), which bears directly on the conductor track carrier.

7. The arrangement as claimed in claim 1, wherein the housing has at least one fixing section (160) screwed to the conductor track carrier.

8. The arrangement as claimed in claim 7,
wherein the fixing section has a fixing hole (170), through which a fixing screw (180) extends, and
wherein a diameter of the fixing hole is dimensioned to be greater than a diameter of the fixing screw, such that a play that reduces mechanical stresses is present between the fixing hole and the fixing screw.

9. The arrangement as claimed in claim 1, wherein the electrical interface comprises a plurality of bent electrical soldering connection elements, which form one or a plurality of coplanar electrical lines.

10. The arrangement as claimed in claim 1, wherein at least one bent electrical soldering connection element is slotted and forms at least two mutually adjacent electrical individual conductors (330, 340).

11. The arrangement as claimed in claim 1, wherein a group (300, 350) of mutually adjacent bent electrical soldering connection elements is electrically connected up in the order ground, signal, ground, signal, ground.

12. The arrangement as claimed in claim 11, wherein a central soldering connection element (310) of the group (350), connected to ground, is slotted and forms in each case two mutually adjacent individual ground conductors, such that an electrical connection configuration ground, signal, ground, ground, signal, ground arises at the interface with the conductor track carrier.

13. The arrangement as claimed in claim 1, wherein
a thickness of the soldering connection elements connected up as ground conductors and a thickness of the soldering connection elements connected up as signal conductors are equal in magnitude and/or
a ratio between a width of an unslotted ground conductor and a width of a signal conductor is less than or equal to two and/or
a ratio between a width of an individual ground conductor of a slotted soldering connection element that is at ground potential and a width of a signal conductor is less than or equal to two.

14. A method for producing an arrangement (10) comprising an electrical conductor track carrier (20) and a component (30), wherein the component is a fiber-optoelectronic component having a housing (40), at least one electro-optical or optoelectronic component (50), at least one fiber-optic interface (60) connected to the component, and at least one electrical interface (80) for connecting the component on the conductor track carrier, the method comprising:
soldering the component on the conductor track carrier by attaching one end (110) of at least one bent electrical soldering connection element (100) to a base connection section (120) of a housing base (125) of the housing (40) and attaching an other end (130) of the soldering connection element laterally outside of the outer housing contour (140) on the conductor track carrier,
wherein a mechanical play constituting a distance (A) is created between the housing base (125) and the conductor track carrier.

15. The method as claimed in claim 14, wherein a reflection reducing characteristic impedance matching (210) is performed in at least one partial section of a gap (200) between the base connection section and the conductor track carrier.

* * * * *